(12) United States Patent
Bedell et al.

(10) Patent No.: US 8,709,957 B2
(45) Date of Patent: Apr. 29, 2014

(54) SPALLING UTILIZING STRESSOR LAYER PORTIONS

(75) Inventors: Stephen W. Bedell, Wappingers Falls, NY (US); Keith E. Fogel, Hopewell Junction, NY (US); Paul A. Lauro, Brewster, NY (US); Ning Li, White Plains, NY (US); Devendra K. Sadana, Pleasantville, NY (US); Ibrahim Alhomoudi, Alhufof (SA)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 13/481,062

(22) Filed: May 25, 2012

(65) Prior Publication Data

US 2013/0316542 A1 Nov. 28, 2013

(51) Int. Cl.
*H01L 21/31* (2006.01)
*H01L 21/469* (2006.01)

(52) U.S. Cl.
USPC .......... 438/780; 438/513; 438/381; 438/680; 438/706; 438/745; 257/E21.006; 257/E21.007; 257/E21.058; 257/E21.077; 257/E21.092; 257/E21.108; 257/E21.129; 257/E21.17; 257/E21.229; 257/E21.267; 257/E21.304; 257/E21.32; 257/E21.499

(58) Field of Classification Search
USPC ......... 438/780, 381, 680, 706, 745, 513, 311, 438/637, 700, 602, 603, 604, 769; 257/E21.006, E21.007, E21.058, 257/E21.077, E21.108, E21.092, E21.129, 257/E21.17, E21.32, E21.229, E21.267, 257/E21.304, E21.499
See application file for complete search history.

(56) References Cited

U.S. PATENT DOCUMENTS

| | | | |
|---|---|---|---|
| 4,442,137 A | | 4/1984 | Kumar |
| 7,487,684 B2 * | | 2/2009 | Gupta et al. .................... 73/800 |
| 8,420,506 B2 * | | 4/2013 | Bruel ............................ 438/459 |
| 8,429,960 B2 * | | 4/2013 | Landru ...................... 73/150 A |
| 2005/0035351 A1 | | 2/2005 | Chu et al. |
| 2007/0039395 A1 | | 2/2007 | Gupta et al. |
| 2011/0048516 A1 | | 3/2011 | Bedell et al. |
| 2011/0207328 A1 | | 8/2011 | Speakman |

OTHER PUBLICATIONS

Kandula, S. S. V., et al., "Dynamic delamination of patterned thin films", Applied Physics Letters 93, 261902 Dec. 29, 2008.
Authors et al.: Disclosed Anonymously, "Method of removing crack-free surface layers from brittle materials", IP.com No. IPCOM000211574D, IP.com Electronic Publication: Oct. 12, 2011.
Cuomo, J.J., et al., "Digital Recording by Thin Film Spalling", IP.com No. IPCOM000070061D, Original Publication Date: Jul. 1, 1978, Original Disclosure Information: TDB 07-78, pp. 859-860, IP.com Electronic Publication: Feb. 21, 2005.

* cited by examiner

*Primary Examiner* — David Nhu
(74) *Attorney, Agent, or Firm* — Scully, Scott, Murphy & Presser, P.C.; Louis J. Percello, Esq.

(57) ABSTRACT

A method for spalling local areas of a base substrate utilizing at least one stressor layer portion which is located on a portion, but not all, of an uppermost surface of a base substrate. The method includes providing a base substrate having a uniform thickness and a planar uppermost surface spanning across an entirety of the base substrate. At least one stressor layer portion having a shape is formed on at least a portion, but not all, of the uppermost surface of the base substrate. Spalling is performed which removes a material layer portion from the base substrate and provides a remaining base substrate portion. The material layer portion has the shape of the at least one stressor layer portion, while the remaining base substrate portion has at least one opening located therein which correlates to the shape of the at least one stressor layer.

26 Claims, 5 Drawing Sheets

SPALLING UTILIZING STRESSOR LAYER PORTIONS

BACKGROUND

The present disclosure relates to semiconductor manufacturing, and more particularly to a method of spalling, i.e., removing, a material layer portion from a base substrate utilizing at least one stressor layer portion that is formed atop a base substrate.

Devices that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The controlled surface layer removal required for such applications has been successfully demonstrated using a process known as spalling; see U.S. Patent Application Publication No. 2010/0311250 to Bedell et al. Spalling includes depositing a stressor layer on a substrate, placing an optional handle substrate on the stressor layer, and inducing a crack and its propagation below the substrate/stressor interface. This process, which is performed at room temperature, removes a thin layer from the entire surface of the base substrate. By thin, it is meant that the layer thickness is typically less than 100 microns, with a layer thickness of less than 50 microns being more typical.

SUMMARY

The present disclosure provides a method for spalling, i.e., removing, local areas of a base substrate utilizing at least one stressor layer portion which is located on a portion, but not all, of an uppermost surface of a base substrate. The method of the present disclosure can be used to generate a patterned thin film, i.e., material layer portion, with arbitrary shapes from selected areas of the base substrate, while the remaining base substrate now contains at least one opening therein whose shape mimics the arbitrary shape of the at least one material layer portion that has been removed therefrom.

In one aspect of the present disclosure, a method of providing a patterned thin film is provided. The method of the present disclosure includes providing a base substrate having a uniform thickness and a planar uppermost surface spanning across an entirety of the base substrate. At least one stressor layer portion having a shape is then formed on at least a portion, but not all, of the uppermost surface of the base substrate. Spalling is then performed which removes a material layer portion from the base substrate and provides a remaining base substrate portion. The material layer portion has the shape of the at least one stressor layer portion, while the remaining base substrate portion has at least one opening located therein. The opening within the remaining base substrate portions correlates to the shape of the at least one stressor layer portion.

In one embodiment, a method is provided that includes providing a base substrate having a uniform thickness and a planar uppermost surface spanning across an entirety of the base substrate. A patterned mask having at least one opening that exposes a portion of the uppermost surface of the base substrate is then formed. Next, at least one stressor layer portion having a shape is formed atop the exposed portion of the base substrate. Spalling is thereafter performed in which a material layer portion is spalled from the base substrate, wherein the material layer portion has the shape of the at least one stressor layer portion, and wherein a remaining base substrate portion has at least one opening located therein which correlates to the shape of the at least one stressor layer.

In another embodiment, a method is provided that includes providing a base substrate having a uniform thickness and a planar uppermost surface spanning across an entirety of the base substrate. A stressor layer portion is then formed atop a portion of the uppermost surface of the base substrate, while other portions of the uppermost surface are bare. Spalling is then performed in which a material layer portion is spalled from the base substrate, wherein the material layer portion has the shape of the at least one stressor layer portion, and wherein a remaining base substrate portion has at least one opening located therein which correlates to the shape of the at least one stressor layer.

DETAILED DESCRIPTION

Figure 1:
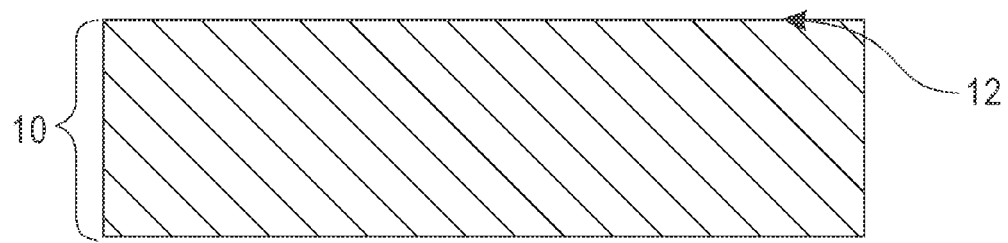
FIG. 1 is a pictorial representation (through a cross sectional view) illustrating a base substrate that can be employed in one embodiment of the present disclosure.

The present disclosure, which discloses a method of spalling material layer regions from a base substrate utilizing patterned stressor layer portions, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

As stated above, the present disclosure provides a method for spalling local areas of a base substrate utilizing at least one stressor layer portion which is located on a portion, but not all, of an uppermost surface of a base substrate. Spalling is a material removal process in which a stressor layer having carefully tuned properties (i.e., stress level and stressor layer thickness) is formed atop a base substrate whereby the stressor layer can generate fracture surfaces within the base substrate in which crack initiation and propagation occurs. Unlike prior art spalling process which typically remove a material layer from an entire surface of a base substrate, the present disclosure provides a localized spalling process in which localized portions, i.e., material layer portions, of the base substrate are removed. Upon removal of the localized portions of the base substrate, the remaining portions of the base substrate are patterned such that an opening is formed therein.

Specifically, the present disclosure provides a method that includes providing a base substrate having a uniform thickness and a planar uppermost surface spanning across an entirety of the base substrate. At least one stressor layer portion having a shape is then formed on at least a portion, but not all, of the uppermost surface of the base substrate. Spalling is performed which removes a material layer portion from the base substrate and provides a remaining base substrate portion. The material layer portion has the shape of the at least one stressor layer portion, while the remaining base substrate portion has at least one opening located therein which correlates to the shape of the at least one stressor layer.

The method of present disclosure can be used in a wide variety of applications including, for example, stretchable electronics such, as, foldable and wearable electronics and photovoltaics, stretchable devices for health monitoring and biomedical applications, electronic skin for human-machine interactions, and focal plane array on curved surfaces for flexible and simpler imaging systems. Previously single crystal semiconductor ribbons for stretchable electronics were generated from semiconductor-on-insulator (SOI) wafers utilizing processes that include etching. However, the material and processing cost of such a prior method is high, and thus not suitable for low cost electronic applications. The thickness of the film formed using prior art processes is also limited and prevents the prior technique to be used in certain applications such as, for example, photovoltaic cell fabrication.

The method of the present disclosure can also reduce chipping which is typically observed utilizing prior art methods for patterning a base substrate. Also, the method of the present disclosure can selectively remove part of the base substrate in certain applications, such as in fabricating micro-electro-mechanical systems (MEMs) or generating test samples (such as transmission electron microscopy (TEM)) in the selected areas of the base substrate.

Referring first to FIG. 1 there is illustrated a base substrate 10 having an uppermost surface 12 that can be employed in one embodiment of the present disclosure. As illustrated, the base substrate 10 has a uniform thickness across the entire length of the base substrate, and the uppermost surface 12 of the base substrate is planar across the entire length of the base substrate. Stated in other terms, the base substrate 10 that is initially used in the present disclosure is not patterned. The base substrate 10 that can be employed in one embodiment of the present disclosure may comprise a semiconductor material, a glass, a ceramic, or any another material whose fracture toughness is less than that of the stressor material to be subsequently described.

Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, GaSb, GaP, GaAs, InAs, InP, and all other III-V or II-VI compound semiconductors. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators.

When the base substrate 10 comprises a semiconductor material, the semiconductor material can be doped, undoped or contain doped regions and undoped regions.

In one embodiment, the semiconductor material that can be employed as the base substrate 10 can be single crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In some embodiments, and when the semiconductor material is a polycrystalline material, the material of the present disclosure spalls certain grains, while leaving certain grains unspalled. As such, spalling of polycrystalline semiconductor material using the method of the present disclosure may produce a non-continuous spalled material layer. In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single crystalline material.

When the base substrate 10 comprises a glass, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, one or more devices including, but not limited to, transistors, capacitors, diodes, BiCMOS, resistors, etc. can be processed on and/or within the upper surface 12 of the base substrate 10 utilizing techniques well known to those skilled in the art. The upper portion of the base substrate that includes the one or more devices can be removed utilizing the method of the present disclosure.

In some embodiments of the present disclosure, the uppermost surface 12 of the base substrate 10 can be cleaned prior to further processing to remove surface oxides and/or other contaminants therefrom. In one embodiment of the present disclosure, the base substrate 10 is cleaned by applying to the base substrate 10 a solvent such as, for example, acetone and isopropanol, which is capable of removing contaminates and/or surface oxides from the upper surface 12 of the base substrate 10.

In some embodiments of the present disclosure, the uppermost surface 12 of the base substrate 10 can be made hydrophobic by oxide removal prior to use by dipping the uppermost surface 12 of the base substrate 10 into hydrofluoric acid. A hydrophobic, or non-oxide, surface provides improved adhesion between the cleaned surface and certain stressor materials to be deposited.

Figure 2:
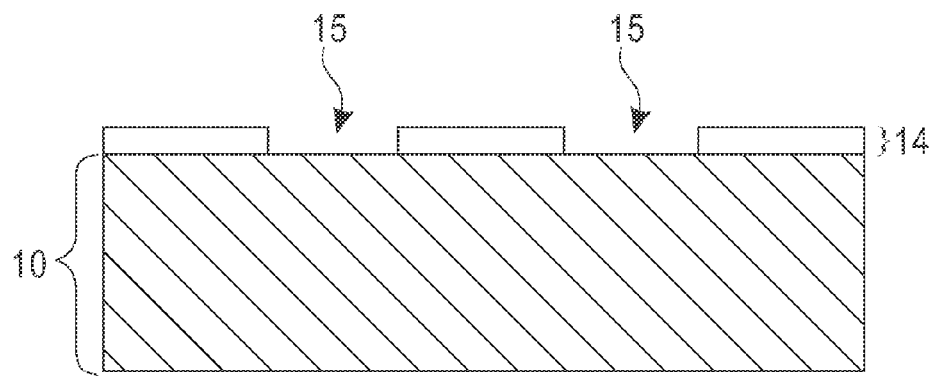
FIG. 2 is a pictorial representation (through a cross sectional view) illustrating the structure of FIG. 1 after forming a patterned mask atop the uppermost surface of the base substrate.

Referring now to FIG. 2, there is illustrated the structure of FIG. 1 after forming a patterned mask 14 having at least one opening 15 that exposes a portion of the uppermost surface 12 of the base substrate 10 in accordance with one embodiment of the present disclosure. The at least one opening 15 that is formed in the patterned mask 14 has a shape which will be used to define the shape of the at least one stressor layer portion to be subsequently formed. In one embodiment, the at least one opening 15 is in the shape of a trench. In another embodiment, the at least one opening 15 is in the shape of a coil. The shape of the film is determined by the applications. Any arbitrary shapes can be spalled using this method of the present disclosure. Examples of other possible shapes including squares, ribbons, zigzag, springs, etc.

The patterned mask 14 can be formed by first providing a blanket layer of a mask material on the entire uppermost surface 12 of the base substrate 10. The blanket layer of mask material can be formed utilizing conventional techniques well known to those skilled in the art. For example, and in one embodiment, the blanket layer of mask material can be formed by a thermal technique such as, for example, oxidation and/or nitridation. Alternatively, and in another embodiment, the blanket layer of mask material can be formed by a deposition process including, for example, spin-on deposition, chemical solution deposition, chemical vapor deposition, and plasma enhanced chemical vapor deposition.

The mask material that can be used to form patterned mask 14 may comprise an inorganic mask material such as an inorganic oxide, nitride, and/or oxynitride. Alternatively, the mask material that can be used to form patterned mask 14 may comprise an organic mask material such as, for example, an antireflective coating and/or photoresist. In yet other embodiments, any combination of mask materials can be used. For example, a mask material stack of an inorganic oxide, e.g., silicon oxide, and a photoresist can be employed.

The blanket layer of mask material can then be patterned by photography and optionally etching. When a photoresist is used as the sole mask material etching is optional. Photolithography includes exposing the photoresist material to a desired pattern of radiation and then developing the exposed or unexposed portions of the photoresist material. When an inorganic mask is used, a photoresist material is typically applied atop the inorganic mask material prior to photolithograph and then etching is used to transfer the pattern from the developed photoresist to the underlying inorganic mask material. Etching may include dry etching (i.e., reactive ion etching, ion beam etching, plasma etching or laser ablation), chemical wet etching or a combination thereof.

Figure 3:
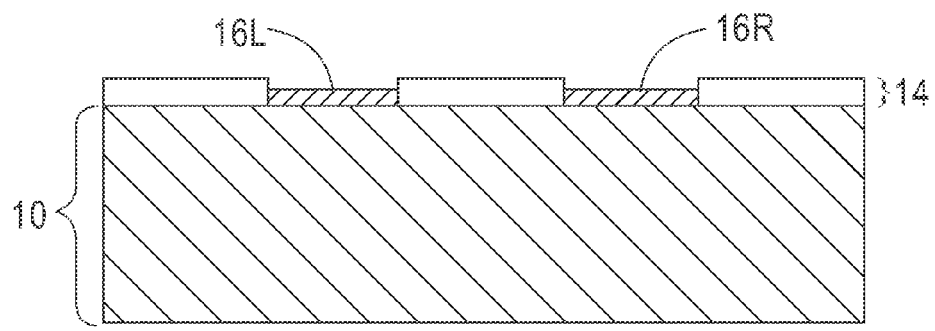
FIG. 3 is a pictorial representation (through a cross sectional view) illustrating the structure of FIG. 2 after forming optional metal-containing adhesion layer portions on exposed portions of the uppermost surface of the base substrate.

Referring now to FIG. 3, there is illustrated the base substrate 10 of FIG. 1 after forming an optional metal-containing adhesion layer portion 16L, 16R on the exposed uppermost surface 12 of base substrate 10. The optional metal-containing adhesion layer portion 16L, 16R is employed in embodiments in which the stressor material to be subsequently formed has poor adhesion to the exposed uppermost surface 12 of base substrate 10. Typically, the metal-containing adhesion layer portion 16L, 16R is employed when a stressor material comprised of a metal is employed. In some embodiments, an optional plating seed layer portion (not shown) can be formed directly atop the exposed uppermost surface 12 of the base substrate 10 instead of the optional metal-containing adhesion layer portion 16L, 16R. In other embodiments, a multilayered stack of the optional metal-containing adhesion layer portion 16L, 16R and the optional plating seed layer portions can be formed. The optional metal-containing adhesion layer portion 16L, 16R and/or the optional plating seed layer portion each have the same shape as that of the at least one opening 15 formed into the blanket layer of mask material. As shown, none of the optional metal-containing adhesive portion 16L, 16R, and none of the optional plating seed layer portion forms atop mask 14.

The optional metal-containing adhesion layer portion 16L, 16R employed in the present disclosure includes any metal adhesion material such as, but not limited to, Ti/W, Ti, Cr, Ni or any combination thereof. The optional metal-containing adhesion layer portion 16L, 16R may comprise a single layer or it may include a multilayered structure comprising at least two layers of different metal adhesion materials.

The metal-containing adhesion layer portion 16L, 16R that can be optionally formed on the exposed uppermost surface 12 of base substrate 10 can be formed at room temperature (15° C.-40° C., i.e., 288K to 313K) or above. In one embodiment, the optional metal-containing adhesion layer portion 16L, 16R can be formed at a temperature which is from 20° C. (293K) to 180° C. (353K). In another embodiment, the optional metal-containing adhesion layer portion 16L, 16R can be formed at a temperature which is from 20° C. (293K) to 60° C. (333K).

The metal-containing adhesion layer portion 16L, 16R, which may be optionally employed, can be formed utilizing selective deposition techniques that are well known to those skilled in the art. For example, the optional metal-containing adhesion layer portion 16L, 16R can be formed by sputtering, and plating. When sputter deposition is employed, the sputter deposition process may further include an in-situ sputter clean process before the deposition.

When employed, the optional metal-containing adhesion layer portion 16L, 16R typically has a thickness from 5 nm to 200 nm, with a thickness from 100 nm to 150 nm being more typical. Other thicknesses for the optional metal-containing adhesion layer portion 16L, 16R that are below and/or above the aforementioned thickness ranges can also be employed in the present disclosure.

The optional plating seed layer portion (not shown) is typically employed in embodiments in which the stressor material to be subsequently formed is a metal and plating is used to form the metal-containing stressor material. The optional plating seed layer portion is employed to selectively promote subsequent plating of a pre-selected metal-containing stressor material. The optional plating seed layer portion may comprise, for example, single layer of Ni or a layered structure of two or more metals such as Al(bottom)/Ti/Ni (top).

The thickness of the optional plating seed layer portion may vary depending on the material or materials of the optional plating seed layer as well as the technique used in forming the same. Typically, the optional plating seed layer portion has a thickness from 2 nm to 400 nm. The optional plating seed layer portion can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In accordance with the present disclosure, the optional metal-containing adhesion layer portion 16L, 16R and/or the optional plating seed layer portion is (are) formed at a temperature which does not effectuate spontaneous spalling to occur within the base substrate 10. By "spontaneous" it is meant that the removal of a thin material layer from a base substrate occurs without the need to employ any manual means to initiate crack formation and propagation for breaking apart the thin material layer from the base substrate. By "manual" it is meant that crack formation and propagation are explicit for breaking apart the thin material layer from the base substrate.

Figure 4:
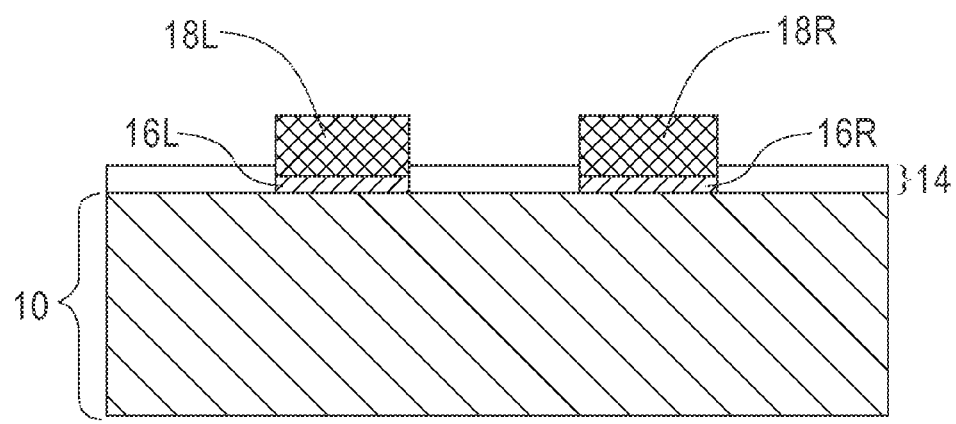
FIG. 4 is a pictorial representation (through a cross sectional view) illustrating the structure of FIG. 3 after forming stressor layer portions on the exposed uppermost surface of each optional metal-containing adhesion layer portion.

Referring now to FIG. 4, there is illustrated the structure of FIG. 3, after forming a stressor layer portion 18L, 18R atop the exposed uppermost surface 12 of the base substrate 10 that is not protected by patterned mask 14. None of the stressor layer portion 18L, 18R forms atop patterned mask 14. The stressor layer portion 18L, 18R employed in the present disclosure includes any material that is under tensile stress on base substrate 10 at the spalling temperature. As such, the stressor layer portion 18L, 18R can also be referred to herein as a stress-inducing layer portion. In accordance with the present disclosure, each stressor layer portion 18L, 18R has a critical thickness and stress value that cause spalling mode fracture to occur within the base substrate 10. By "spalling mode fracture" it is meant that a crack is formed within base substrate 10 and the combination of loading forces maintain a crack trajectory at a depth below the stressor/substrate interface. By critical condition, it is meant that for a given stressor material and base substrate material combination, a thickness value and a stressor value for the stressor layer is chosen that render spalling mode fracture possible (can produce a $K_I$ value greater than the $K_{IC}$ of the substrate).

As stated above, the stressor layer portion 18L, 18R has the same shape as that of the at least one opening 15 formed into the blanket layer of mask material. The thickness of the stressor layer portion 18L, 18R is chosen to provide the desired fracture depth within the base substrate 10. For example, if the stressor layer portion 18L, 18R is chosen to be Ni, then fracture will occur at a depth below the stressor layer 16 roughly 2 to 3 times the Ni thickness. The stress value for the stressor layer portion 18L, 18R is then chosen to satisfy the critical condition for spalling mode fracture. This can be estimated by inverting the empirical equation given by $t^* = [(2.5 \times 10^6)(K_{IC}^{3/2})]/\sigma^2$, where $t^*$ is the critical stressor layer thickness (in microns), $K_{IC}$ is the fracture toughness (in units of MPa·m$^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

Illustrative examples of materials that are under tensile stress when applied atop the base substrate 10 and thus can be used as the stressor layer portion 18L, 18R include, but are not limited to, a metal, a polymer, such as a spall inducing tape layer, or any combination thereof. The stressor layer portion 18L, 18R may comprise a single stressor layer, or a multilayered stressor structure including at least two layers of different stressor material can be employed.

In one embodiment, the stressor layer portion 18L, 18R is a metal. In another embodiment, the stressor layer portion 18L, 18R is a spall inducing tape. In another embodiment, for example, the stressor layer portion 18L, 18R may comprise a two-part stressor layer including a lower part and an upper part. The upper part of the two-part stressor layer can be comprised of a spall inducing tape layer.

When a metal is employed as the stressor layer portion 18L, 18R, the metal can include, for example, Ni, Cr, Fe, or W. Alloys of these metals can also be employed. In one embodiment, the stressor layer portion 18L, 18R includes at least one layer consisting of Ni.

When a polymer is employed as the stressor layer portion 18L, 18R, the polymer is a large macromolecule composed of repeating structural units. These subunits are typically connected by covalent chemical bonds. Illustrative examples of polymers that can be employed as the stressor layer portion 18L, 18R include, but are not limited to, polyimides polyesters, polyolefins, polyacrylates, polyurethane, polyvinyl acetate, and polyvinyl chloride.

When a spall inducing tape layer is employed as the stressor layer portion 18L, 18R, the spall inducing tape layer includes any pressure sensitive tape that is flexible, soft, and stress free at a first temperature used to form the tape, yet strong, ductile and tensile at a second temperature used during removal of the upper portion of the base substrate 10. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 10 (with a lower thermal coefficient of expansion) and the tape (with a higher thermal expansion coefficient).

Typically, the pressure sensitive tape that is employed in the present disclosure as stressor layer portion 18L, 18R includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer portion 18L, 18R employed in the present disclosure can be formed at a first temperature which is at room temperature (15° C.-40° C.). In another embodiment, when a tape layer is employed, the tape layer can be formed at a first temperature which is from 15° C. to 60° C.

When the stressor layer portion 18L, 18R is a metal or polymer, the stressor layer portion 18L, 18R can be formed utilizing selective deposition techniques that are well known to those skilled in the art including, for example, dip coating, spin-coating, brush coating, sputtering, and plating.

When the stressor layer portion 18L, 18R is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer portion 18L, 18R include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the exposed uppermost surface 12 of the base substrate 10, wherein a lower part of the two-part stressor layer is formed at a first temperature which is at room temperature or slight above (e.g., from 15° C. to 60° C.), wherein an upper part of the two-part stressor layer comprises a spall inducing tape layer at an auxiliary temperature which is at room temperature.

If the stressor layer portion 18L, 18R is of a metallic nature, it typically has a thickness of from 3 μm to 50 μm, with a thickness of from 4 μm to 7 μm being more typical. Other thicknesses for the stressor layer portion 18L, 18R that are below and/or above the aforementioned thickness ranges can also be employed in the present disclosure.

If the stressor layer portion 18L, 18R is of a polymeric nature, it typically has a thickness of from 10 μm to 200 μm, with a thickness of from 50 μm to 100 μm being more typical. Other thicknesses for the stressor layer portion 18L, 18R that are below and/or above the aforementioned thickness ranges can also be employed in the present disclosure.

In one embodiment in which multiple openings are formed into the patterned mask 14, each stressor layer portion 18L, 18R can have a same composition and a same thickness. In another embodiment in which multiple openings are formed into the patterned mask 14, each stressor layer portion 18L, 18R can have a same composition and a different thickness. In yet another embodiment in which multiple openings are formed into the patterned mask 14, each stressor layer portion 18L, 18R can have a different composition and a same thickness. In still yet another embodiment in which multiple openings are formed into the patterned mask 14, each stressor layer portion 18L, 18R can have a different composition and a different thickness. In yet another embodiment, some of the stressor layer portions can be of a first composition and have a first thickness, while other stressor layer portions can be of a second composition and have a second thickness wherein the at least one of the second composition and second thickness is different from at least one of the first composition and first thickness.

Figure 5:
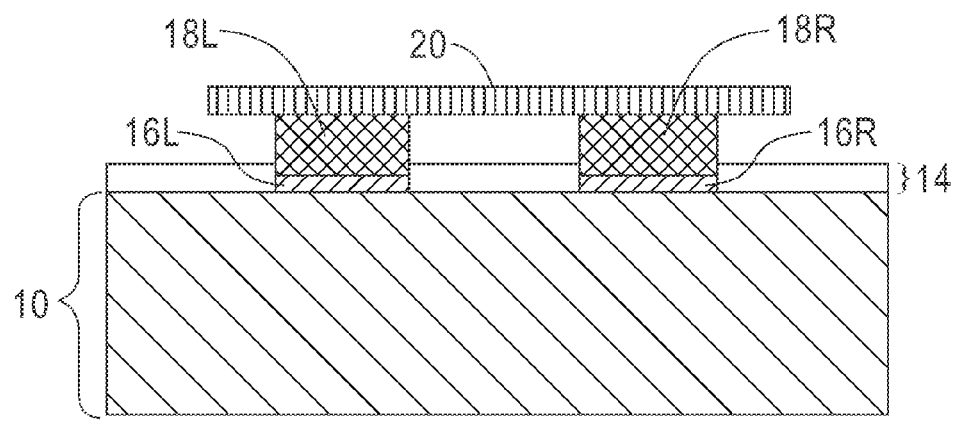
FIG. 5 is a pictorial representation (through a cross sectional view) illustrating the structure of FIG. 4 after forming an optional handle substrate atop the stressor layer portions.

Referring to FIG. 5, there is depicted the structure of 4 after forming an optional handle substrate 20 atop stressor layer portion 18L, 18R. The optional handle substrate 20 employed in the present disclosure comprises any flexible material which has a minimum radius of curvature that is typically less than 30 cm. Illustrative examples of flexible materials that can be employed as the optional handle substrate 20 include a metal foil or a polyimide foil. The optional handle substrate 20 can be used to provide better fracture control and more versatility in handling the spalled portion, i.e., the portion of the base substrate below the stressor layer portion 18A, 18B and above the fracture surfaces of the base substrate 10. Moreover, the optional handle substrate 20 can be used to guide the crack propagation during spalling. The optional handle substrate 20 of the present disclosure is typically, but not necessarily, formed at a first temperature which is at room temperature (15° C.-40° C.).

The optional handle substrate 20 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. The optional handle substrate 20 typical has a thickness of from 1 μm to few mm, with a thickness of from 70 μm to 120 μm being more typical. Other thicknesses for the optional handle substrate 20 that are below and/or above the aforementioned thickness ranges can also be employed in the present disclosure.

Figure 6:
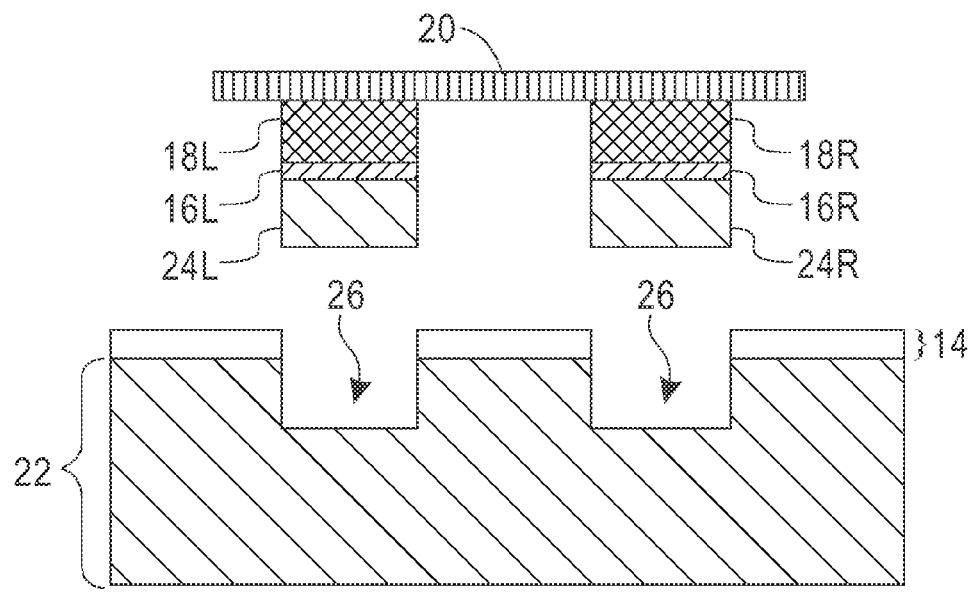
FIG. 6 is a pictorial representation (through a cross sectional view) illustrating the structure of FIG. 5 after spalling.

Referring now to FIG. 6, there is depicted the structure of FIG. 5 after removing a material layer portion 24L, 24R from the original base substrate 10 by spalling; no etching is used to remove material layer portion 24L, 24R from base substrate 10. Material layer portion 24L, 24R can also be referred to herein as a spalled material layer portion of the base substrate 10. In the drawings, reference numeral 22 denotes a remaining base substrate portion. As is shown, the material layer portion 24L, 24R has the shape of the at least one stressor layer portion 18L, 18R, while the remaining base substrate portion 22 has at least one opening 26 located therein which correlates to the shape of the at least one stressor layer portion 18L, 18R.

Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly warm up to room temperature by allowing the same to stand at room temperature. Alternatively, the spalled structure can be heated up to room temperature utilizing any heating means.

After spalling, the optional handle substrate 20, the stressor layer portion 18A, 18B, and, if present the optional plating seed layer portion and the optional metal-containing adhesion layer portion 16l, 16R can be removed from each material layer portion 24L, 24R that was removed from the original base substrate 10. The optional handle substrate 20, the stressor layer portion 18A, 18B, the optional plating seed layer portion and the optional metal-containing adhesion layer portion 16L, 16R can be removed from each material layer portion 24L, 24R of the base substrate utilizing conventional techniques well known to those skilled in the art. For example, and in one embodiment, aqua regia ($HNO_3/HCl$)

can be used for removing the optional handle substrate 20, the stressor layer portion 18R, 18L, the optional plating seed layer portion and the optional metal-containing adhesion layer portion 16L, 16R. In another example, UV or heat treatment is used to remove the optional handle substrate 20, followed by a chemical etch to remove the stressor layer portion 18L, 18R, followed by a different chemical etch to remove the optional plating seed layer portion and optional metal-containing adhesion layer portion 16L, 16R. In some embodiments, the patterned mask 14 can be removed from atop the remaining base substrate portion 22 utilizing techniques well known to those skilled in the art. For example, chemical etching, resist stripping, and/or planarization can be used to remove the patterned mask 14 from atop the remaining base substrate portion 22.

The thickness of the material layer portion 24L, 24R that was removed from the base substrate 10 varies depending on the material of the stressor layer portion 18L, 18R and the material of the base substrate 10 itself. In one embodiment, each material layer portion 24L, 24R that was removed from the base substrate 10 has a thickness of less than 100 microns. In another embodiment, each material layer portion 24L, 24R spalled from the base substrate 10 has a thickness of less than 50 microns. In one embodiment, each material layer portion 24L, 24R can have a same thickness, while in other embodiments each material layer portion 24L, 24R can have different thicknesses. In yet another embodiment, some of the material layer portions have a first thickness and some of the material layer portions have a second thickness which is different from the first thickness.

In one embodiment, each opening 26 that is formed into the remaining base substrate portion 22 can have a same depth, as measured from the uppermost surface of the remaining base substrate portion 22 to the bottommost wall of the opening 26. In another embodiment, each opening 26 that is formed into the remaining base substrate portion 22 can have a different depth, as measured from the uppermost surface of the remaining base substrate portion 22 to the bottommost wall of the opening 26. In yet another embodiment, some of openings have a first depth and some of the openings have a second depth which is different from the first depth.

Reference is now made to FIGS. 7-11 which illustrate another embodiment of the present disclosure. This embodiment of the present disclosure is similar to the embodiment depicted in FIGS. 1-6 except that blanket layers of the optional metal-containing adhesion layer, the optional plating seed layer and the stressor layer are first formed and thereafter the blanket layers are patterned into at least one stack that includes an optional metal-containing adhesion layer portion, an optional plating seed layer portion and a stressor layer portion.

Figure 7:
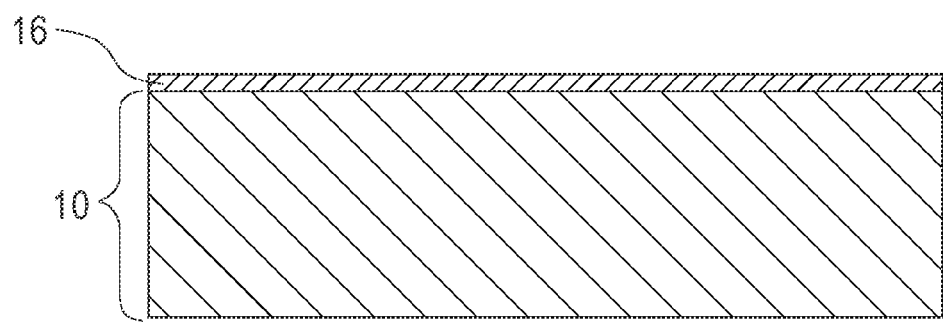
FIG. 7 is a pictorial representation (through a cross sectional view) illustrating the structure of FIG. 1 after forming a blanket layer of an optional metal-containing adhesion layer on the uppermost surface of the base substrate.

Referring first to FIG. 7, there is shown the structure of FIG. 1 after forming a blanket layer of an optional metal-containing adhesion layer 16 across the entire uppermost surface 12 of the base substrate 10. The blanket layer of an optional metal-containing adhesion layer 16 has a thickness and comprises one of the materials mentioned above for the optional metal-containing adhesion layer portion 16L, 16R. The blanket layer of optional metal-containing adhesion layer 16 can be formed within the temperature range mentioned above for the optional metal-containing adhesion layer portion 16L, 16R. The blanket layer of the optional metal-containing adhesion layer 16 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

A blanket layer of optional plating seed layer (not shown) can be used in conjunction with, or in place of, the blanket layer of an optional metal-containing adhesion layer 16. The blanket layer of optional plating seed layer (not shown) can comprise one of the materials mentioned above for the optional plating seed layer portion, and it can have a thickness within a range of the optional plating seed layer portion mentioned above and be formed utilizing one of the techniques as mentioned above for the optional plating seed layer portion as well.

Figure 8:
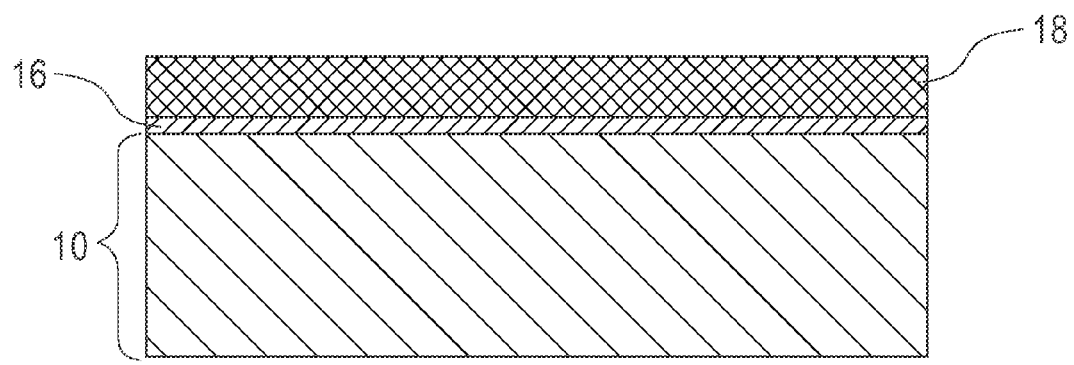
FIG. 8 is a pictorial representation (through a cross sectional view) illustrating the structure of FIG. 7 after forming a blanket layer of a stressor layer on an uppermost surface of the optional metal-containing adhesion layer.

Referring to FIG. 8, there is shown the structure of FIG. 7 after forming a blanket layer of stressor material, herein after stressor layer 18, entirely atop the base substrate 10. The stressor layer 18 can be formed on the exposed surfaces of one of the blanket layer of the optional metal-containing adhesion layer 16, the blanket layer of optional plating seed layer, or the uppermost surface 12 of the base substrate 10.

The stressor layer 18 can comprise one of the stress inducing materials mentioned above for stressor layer portion 18L, 18R. The stressor layer 18 can have a thickness within the range mentioned above for stressor layer portion 18L, 18R and it can be formed at one of the temperatures ranges mentioned above for stressor layer portion 18L, 18R.

When the stressor layer 18 comprises a metal or polymer, dip coating, spin-coating, brush coating, sputtering, chemical vapor deposition, plasma enhanced chemical vapor deposition, chemical solution deposition, physical vapor deposition, and plating can be used to form stressor layer 18. When the stressor layer 18 is a spall inducing tape layer, the tape layer can be applied by hand or by mechanical means to the structure.

Figure 9:
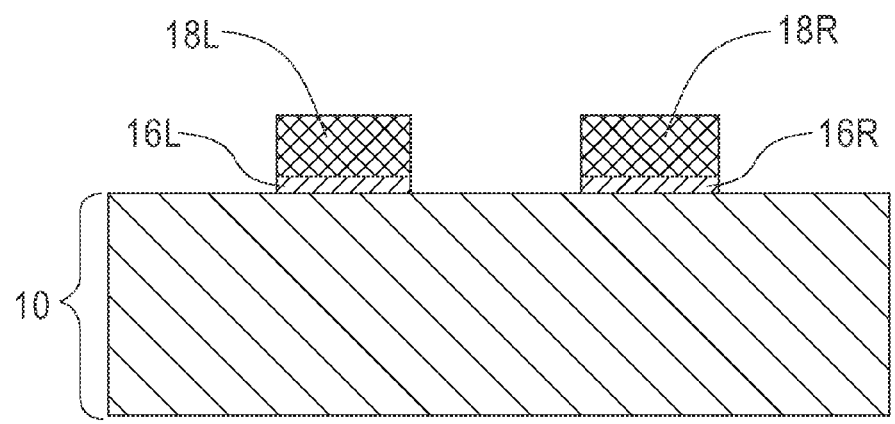
FIG. 9 is a pictorial representation (through a cross sectional view) illustrating the structure of FIG. 8 after patterning at least the stressor layer into stressor layer portions.

Referring now to FIG. 9, there is illustrated the structure of FIG. 8 after patterning at least the stressor layer 18 into at least one stressor layer portion 18L, 18R. In some embodiments, the blanket layer of optional metal-containing adhesion layer 16 and/or the plating seed layer (not shown) is(are) patterned into optional metal-containing adhesion layer portion 16L, 16R and/or optional plating seed layer portions (not shown).

The structure shown in FIG. 9 can be formed by applying a photoresist atop the stressor layer and then patterning the photoresist by photolithography. After patterning the photoresist, one or more etching processes (dry and/or wet etching) can be used to transfer the pattern from the patterned photoresist into the structure shown in FIG. 9. After transferring the pattern into the blanket layers located beneath the patterned photoresist, the patterned photoresist can be removed utilizing a conventional stripping process such as, for example, ashing.

Figure 10:
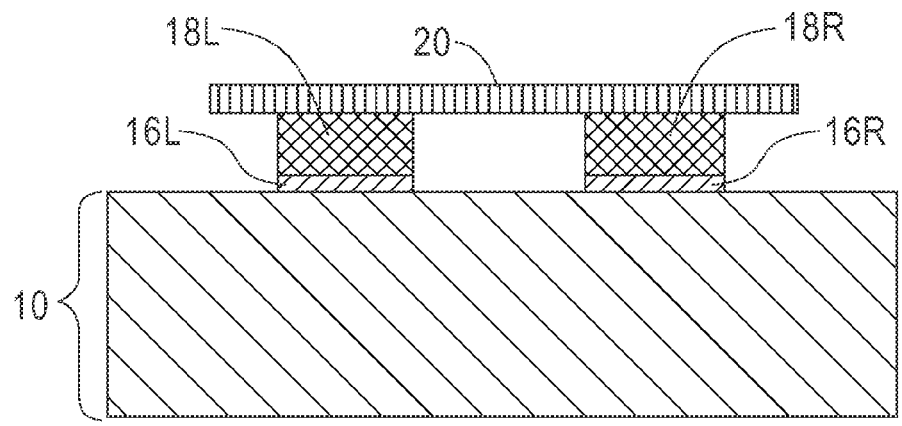
FIG. 10 is a pictorial representation (through a cross sectional view) illustrating the structure of FIG. 9 after forming an optional handle substrate atop the stressor layer portions.

Referring now to FIG. 10, there is depicted the structure of FIG. 9 after forming an optional handle substrate 20 atop the stressor layer portions 18L, 18R. The description above with respect to the handle substrate 20 employed in the previously described embodiment applies equally well here for this embodiment of the present discourse and, as such, is incorporated herein by reference.

Figure 11:
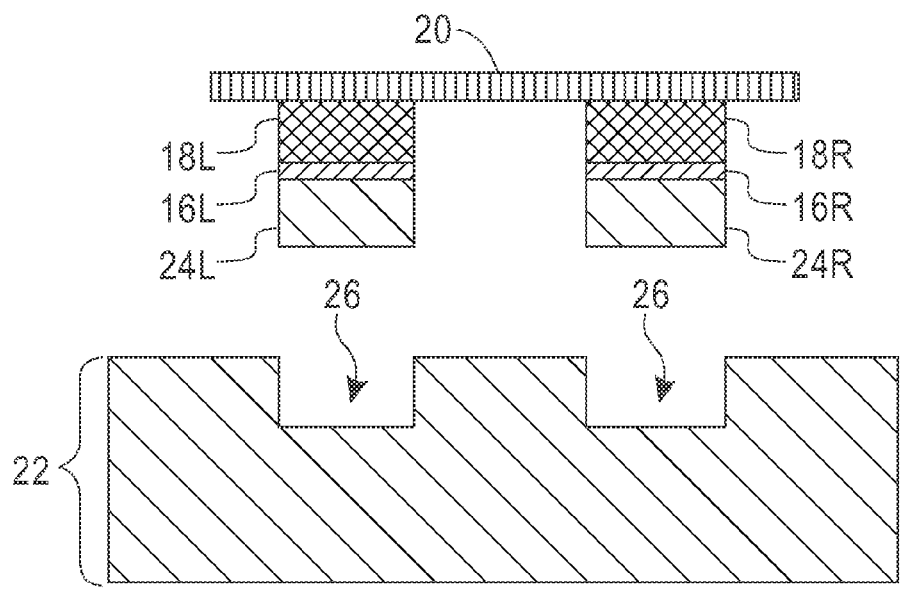
FIG. 11 is a pictorial representation (through a cross sectional view) illustrating the structure of FIG. 10 after spalling.

Referring now to FIG. 11, there is illustrated the structure of FIG. 10 after spalling. Spalling can be performed utilizing the conditions mentioned in the previous embodiment of the present disclosure. After spalling, a material layer portion 24L, 24R, and a remaining base substrate portion 22 having at least one opening 26 are formed. The details within respect to the material layer portion 24L, 24R, and the remaining base substrate portion 22 having at least one opening 26 in the previous embodiment apply equal well here for this embodiment and, as such, are incorporated herein by reference.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed as new is:

1. A method for providing a semiconductor structure comprising:
    providing a base substrate having a uniform thickness and a planar uppermost surface spanning across an entirety of the base substrate;
    forming at least one stressor layer portion having a shape on at least a portion, but not all, of the planar uppermost surface of the base substrate; and
    removing a material layer portion from the base substrate by spalling, wherein the material layer portion has the shape of the at least one stressor layer portion, and wherein a remaining base substrate portion has at least one opening located therein which correlates to the shape of the at least one stressor layer.

2. The method of claim 1, wherein said base substrate has a fracture toughness that is lower than a fracture toughness of said at least one stressor layer portion.

3. The method of claim 2, wherein said base substrate comprises a semiconductor material, a glass or a ceramic.

4. The method of claim 1, wherein said forming said stressor layer portion comprises:
    forming a blanket layer of mask material on said planar uppermost surface of said base substrate;
    forming an opening in said blanket layer of mask material that exposes at least one portion of the planar uppermost surface of the base substrate;
    selecting a stressor material having a higher fracture toughness than said base substrate; and
    forming said stressor material atop said exposed planar uppermost surface of the base substrate.

5. The method of claim 1, wherein said forming said stressor layer portion comprises:
    providing a blanket layer of stressor material atop an entirety of said planar uppermost surface of said base substrate; and
    patterning said blanket layer of stressor material by lithography and etching.

6. The method of claim 1, further comprising forming at least one of a metal-containing adhesion layer portion and a plating seed layer portion beneath said at least one stressor layer portion.

7. The method of claim 1, wherein said stressor layer portion comprises a metal, a polymer or any combination thereof.

8. The method of claim 7, wherein said stressor layer portion includes at least said polymer, and said polymer is a spall inducing tape layer.

9. The method of claim 1, wherein said spalling is performed at room temperature or a temperature less than room temperature.

10. The method of claim 1, further comprising forming a handle substrate atop said stressor layer portion prior to spalling.

11. A method for providing a semiconductor structure comprising:
    providing a base substrate having a uniform thickness and a planar uppermost surface spanning across an entirety of the base substrate;
    forming a patterned mask having at least one opening that exposes a portion of said planar uppermost surface of said base substrate;
    forming at least one stressor layer portion having a shape atop said exposed portion of said base substrate; and
    removing a material layer portion from the base substrate by spalling, wherein the material layer portion has the shape of the at least one stressor layer portion, and wherein a remaining base substrate portion has at least one opening located therein which correlates to the shape of the at least one stressor layer.

12. The method of claim 11, wherein said base substrate has a fracture toughness that is lower than a fracture toughness of said at least one stressor layer portion.

13. The method of claim 12, wherein said base substrate comprises a semiconductor material, a glass or a ceramic.

14. The method of claim 11, further comprising forming at least one of a metal-containing adhesion layer portion and a plating seed layer portion on said exposed planar uppermost surface of said base substrate prior to forming said at least one stressor layer portion.

15. The method of claim 11, wherein said stressor layer portion comprises a metal, a polymer or any combination thereof.

16. The method of claim 15, wherein said stressor layer portion includes at least said polymer, and said polymer is a spall inducing tape layer.

17. The method of claim 11, wherein said spalling is performed at room temperature or a temperature less than room temperature.

18. The method of claim 11, further comprising forming a handle substrate atop said stressor layer portion prior to spalling.

19. A method for providing a semiconductor structure comprising:
    providing a base substrate having a uniform thickness and a planar uppermost surface spanning across an entirety of the base substrate;
    forming a stressor layer portion atop a portion of said planar uppermost surface of said base substrate, while other portions of said planar uppermost surface are bare; and
    removing a material layer portion from the base substrate by spalling, wherein the material layer portion has the shape of the at least one stressor layer portion, and wherein a remaining base substrate portion has at least one opening located therein which correlates to the shape of the at least one stressor layer.

20. The method of claim 19, wherein said forming said stressor layer portion comprises:
    providing a blanket layer of stressor material atop an entirety of said planar uppermost surface of said base substrate; and
    patterning said blanket layer of stressor material by lithography and etching.

21. The method of claim 19, wherein said base substrate has a fracture toughness that is lower than a fracture toughness of said at least one stressor layer portion.

22. The method of claim 20, further comprising forming at least one blanket layer of a metal-containing adhesion layer and a blanket layer of a plating seed layer on said planar uppermost surface of said base substrate prior to forming said blanket layer of stressor material.

23. The method of claim 19, wherein said stressor layer portion comprises a metal, a polymer or any combination thereof.

24. The method of claim 19, wherein said stressor layer portion includes at least said polymer, and said polymer is a spall inducing tape layer.

25. The method of claim 19, wherein said spalling is performed at room temperature or a temperature less than room temperature.

26. The method of claim 19, further comprising forming a handle substrate atop said stressor layer portion prior to spalling.

* * * * *